(12) United States Patent
Low et al.

(10) Patent No.: US 7,482,598 B2
(45) Date of Patent: Jan. 27, 2009

(54) TECHNIQUES FOR PREVENTING PARASITIC BEAMLETS FROM AFFECTING ION IMPLANTATION

(75) Inventors: Russell J. Low, Rowley, MA (US); Jonathan Gerald England, Horsham (GB); Stephen E. Krause, Ipswich, MA (US); Eric D. Hermanson, Georgetown, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 231 days.

(21) Appl. No.: 11/567,485

(22) Filed: Dec. 6, 2006

(65) Prior Publication Data

US 2007/0125955 A1   Jun. 7, 2007

Related U.S. Application Data

(60) Provisional application No. 60/748,068, filed on Dec. 7, 2005.

(51) Int. Cl.
*H01J 37/317* (2006.01)
(52) U.S. Cl. .............................. 250/396 R; 250/492.21
(58) Field of Classification Search ............. 250/396 R, 250/492.21
See application file for complete search history.

(56) References Cited

U.S. PATENT DOCUMENTS

| 5,375,451 | A |  | 12/1994 | Sandstrom |
| 5,580,429 | A | * | 12/1996 | Chan et al. ............. 204/192.38 |
| 6,369,874 | B1 |  | 4/2002 | Del Puerto |
| 6,624,081 | B2 | * | 9/2003 | Dykstra et al. ............. 438/710 |
| 2004/0262542 | A1 |  | 12/2004 | Rathmell et al. |

* cited by examiner

*Primary Examiner*—Kiet T Nguyen

(57) ABSTRACT

Techniques for preventing parasitic beamlets from affecting ion implantation are disclosed. In one particular exemplary embodiment, the techniques may be realized as an apparatus for preventing parasitic beamlets from affecting ion implantation. The apparatus may comprise a controller that is configured to scan a spot beam back and forth, thereby forming an ion beam spanning a predetermined width. The apparatus may also comprise an aperture mechanism that, if kept stationary, allows the spot beam to pass through. The apparatus may further comprise a synchronization mechanism, coupled to the controller and the aperture mechanism, that is configured to cause the aperture mechanism to move in synchronization with the scanned spot beam, allowing the scanned spot beam to pass through but blocking one or more parasitic beamlets associated with the spot beam.

28 Claims, 12 Drawing Sheets

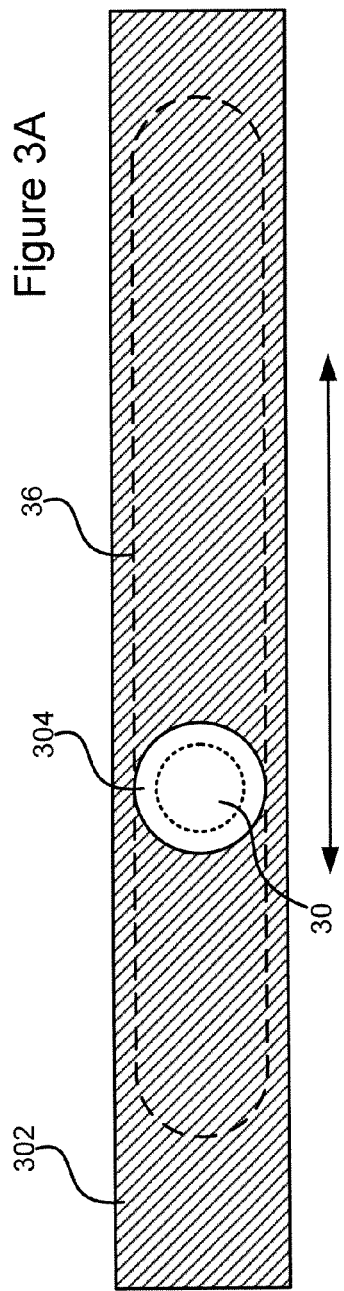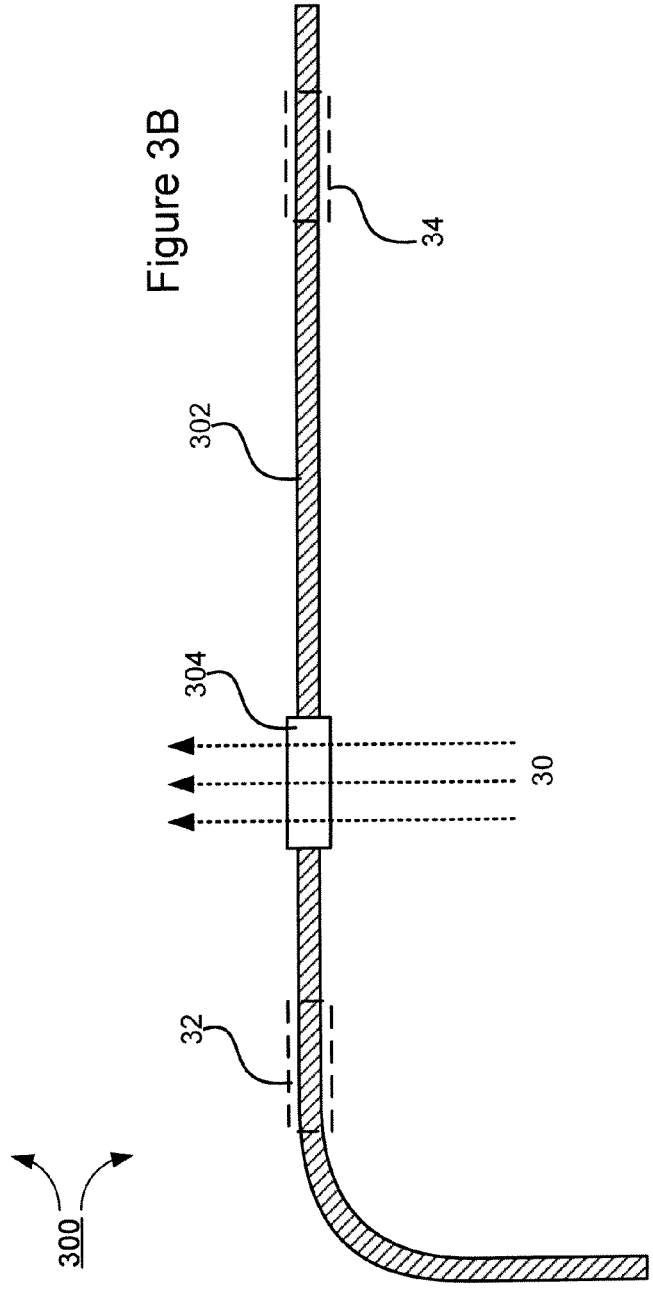

TECHNIQUES FOR PREVENTING PARASITIC BEAMLETS FROM AFFECTING ION IMPLANTATION

CROSS-REFERENCE TO RELATED APPLICATIONS

This patent application claims priority to U.S. Provisional Patent Application No. 60/748,068, filed Dec. 7, 2005, which is hereby incorporated by reference herein in its entirety.

This patent application is related to U.S. Patent Application entitled "Techniques for Reducing Effects of Photoresist Outgassing," filed Dec. 6, 2006, which is hereby incorporated by reference herein in its entirety.

FIELD OF THE DISCLOSURE

The present disclosure relates generally to semiconductor manufacturing and, more particularly, to techniques for preventing parasitic beamlets from affecting ion implantation.

BACKGROUND OF THE DISCLOSURE

Ion implanters are widely used in semiconductor manufacturing to selectively alter the conductivity of materials. In a typical ion implanter, ions generated from an ion source are transported downstream through a series of beamline components which may include one or more analyzer and/or corrector magnets and a plurality of electrodes. The analyzer magnets may be used to select desired ion species and filter out contaminant species or ions having undesirable energies. The corrector magnets may be used to manipulate the shape of the ion beam or otherwise adjust the ion beam quality before it reaches a target wafer. Suitably shaped electrodes can be used to modify the energy and the shape of the ion beam. After the ion beam has been transported through the series of beamline components, it may be directed into an end station to perform ion implantation.

FIG. 1 depicts a conventional ion implanter system 100. As is typical for most ion implanters, the system 100 is housed in a high-vacuum environment. The ion implanter system 100 may comprise an ion source 102 and a series of beamline components through which an ion beam 10 passes. The series of beamline components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target wafer 118. The target wafer 118 is typically housed in an end-station (not shown) under high vacuum.

In semiconductor manufacturing, ion implantation of a target wafer is often performed on only selected areas of the wafer surface, while the rest of the wafer surface is typically masked with a photosensitive material known as "photoresist." Through a photolithography process, the target wafer may be coated with a patterned layer of photoresist material, exposing only selected areas of the wafer surface where ion implantation is desired. During ion implantation, an ion beam makes its impact not only on the exposed portion of the wafer surface, but also on the photoresist layer. The energetic ions often break up chemical bonds within the photoresist material and release volatile organic chemicals and/or other particles into the vacuum chamber (i.e., wafer or workpiece end-station) that houses the target wafer. This phenomenon is known as "photoresist outgassing."

Photoresist outgassing in an ion implanter can have several deleterious effects on an ion beam. For example, the particles released from the photoresist may cause a pressure increase or pressure fluctuations in the high-vacuum wafer end-station. The outgassed particles may also migrate upstream from the wafer end-station to other beamline components, such as the corrector magnet 116 and the scanner 114 as shown in FIG. 1, and may affect vacuum levels in those portions of the ion implanter as well.

The outgassed particles often interact with an incident ion beam, for example, by exchanging charges with beam ions. As a result, an ion with a single positive charge may lose its charge to an outgassed particle and become neutralized; a doubly charged ion may lose one positive charge to an outgassed particle and become singly charged; and so on. As a result, the outgassing-induced charge exchange can interfere with the ion dosimetry system in the ion implanter. A typical ion dosimetry system determines ion doses by integrating a measured beam current over time and converting the integrated beam current (i.e., total ion charges) to a total dose based on an assumption that a particular ion species has a known charge state. The outgassing-induced charge exchange, however, randomly alters the charge state of the ion species, thereby invalidating the charge-state assumption that the ion dosimetry system relies on. For example, if the outgassed particles tend to rob positive charges from positive ions, then such charge exchange will cause the dosimetry system to undercount that ion species, which in turn leads to an over-supply of that ion species to a target wafer.

Due to the above-mentioned upstream migration of outgassed particles, some of the charge exchange may occur in a corrector magnet. Charge-altered ions are subject to a different Lorentz force as compared to those same species of ions that experience no charge exchange. As such, the charge-altered ions will deviate from the main ion beam path, resulting in non-uniform dosing of the target wafer. Beamlets formed by streams of the charge-altered ions are referred to hereinafter as "parasitic beamlets." Apart from generating the parasitic beamlets, the charge exchange can also alter energies and angles of the affected ions, both of which will affect the ultimate dopant profile in the target wafer.

As those skilled in the art will readily appreciate, the above-described parasitic beamlet problems may similarly arise in an ion implanter running a molecular ion beam. Interactions of the molecular ion beam with residual gases in the ion implanter may cause molecular breakups, resulting in ions with altered charges as well as altered masses. Therefore, the molecular breakups can also introduce contamination to the ion implantation process.

A number of techniques have been developed to alleviate the effects of outgassing-induced charge exchange. For example, to compensate for the effect of charge exchange on dosimetry, it has been proposed that an direct current (DC) offset be included in the beam current integration process, the DC offset being correlated to a gas pressure in the wafer end-station. However, this dosimetry compensation approach only addresses one aspect of the problems caused by parasitic beamlets.

According to another approach, the above-mentioned pressure fluctuation caused by photoresist outgassing may be mitigated by bleeding inert gases into a wafer end-station in an amount much greater than the level of outgassing. While this method might stabilize the gas pressure in the wafer end-station, the resulting higher-than-optimum pressure may negatively affect the ion implantation.

According to yet another approach as illustrated in FIG. 2, a conductance-limiting aperture 202 may be provided between a wafer end-station 204 and beamline components 206. The conductance-limiting aperture 202 is typically a fixed aperture that is just wide enough to allow a scanned ion beam 20 to pass through. The conductance-limiting aperture 202 is intended to serve two purposes, i.e., to reduce an upstream migration of outgassed particles and to block parasitic beamlets from entering the wafer end-station 204. However, since the conductance-limiting aperture 202 has to be wider than the diameter of a target wafer 208, this approach can achieve only limited success in reducing conductance of outgassed particles or blocking parasitic beamlets.

In view of the foregoing, it would be desirable to provide a solution to reduce effects of photoresist outgassing which overcomes the above-described inadequacies and shortcomings.

SUMMARY OF THE DISCLOSURE

Techniques for preventing parasitic beamlets from affecting ion implantation are disclosed. In one particular exemplary embodiment, the techniques may be realized as an apparatus for preventing parasitic beamlets from affecting ion implantation. The apparatus may comprise a controller that is configured to scan a spot beam back and forth, thereby forming an ion beam spanning a predetermined width. The apparatus may also comprise an aperture mechanism that, if kept stationary, allows the spot beam to pass through. The apparatus may further comprise a synchronization mechanism, coupled to the controller and the aperture mechanism, that is configured to cause the aperture mechanism to move in synchronization with the scanned spot beam, allowing the scanned spot beam to pass through but blocking one or more parasitic beamlets associated with the spot beam.

In accordance with other aspects of this particular exemplary embodiment, the aperture mechanism may be located at or near an entrance of an end-station in an ion implanter.

In accordance with further aspects of this particular exemplary embodiment, the aperture mechanism may comprise a shutter plate having an aperture that is slightly larger than the spot beam, and the shutter plate may be actuated by the synchronization mechanism to slide the aperture back and forth in synchronization with the scanned spot beam. The shutter plate may comprise a strip of flexible material. At least one portion of the shutter plate may be folded then stretched when the shutter plate is actuated by the synchronization mechanism.

In accordance with additional aspects of this particular exemplary embodiment, the aperture mechanism may comprise one or more shutter plates that rotate in synchronization with the scanned spot beam to block the one or more parasitic beamlets associated with the spot beam. The aperture mechanism may comprise two shutter plates that rotate in coordination with each other to form a slit that moves in synchronization with the scanned spot beam.

In accordance with another aspect of this particular exemplary embodiment, the aperture mechanism may comprise a rotatable member having one or more slits such that, when the rotatable member is rotating at a predetermined frequency, the scanned spot beam is able to pass through one of the one or more slits at any location along the predetermined width of the ion beam. The rotatable member may have an axis of rotation substantially in parallel with the ion beam, and the one or more slits may be curved according to a spiral pattern. Alternatively, the rotatable member may have an axis of rotation perpendicular to the ion beam, and the rotatable member may be configured to oscillate around the axis to cause the one or more slits to move in synchronization with the scanned spot beam.

In accordance with yet another aspect of this particular exemplary embodiment, the aperture mechanism may comprise a plurality of electrodes, and the synchronization mechanism may be configured to change voltages applied to the plurality of electrodes in synchronization with the scanned spot beam, such that an electrostatic aperture allows the scanned spot beam to pass through but blocks the one or more parasitic beamlets associated with the spot beam. The plurality of electrodes may be arranged into multiple pairs of parallel plates, and the synchronization mechanism may apply to each pair of parallel plates a zero voltage if the scanned spot beam is between the pair of parallel plates, and a substantial deflection voltage if the scanned spot beam is not between the pair of parallel plates.

In accordance with still another aspect of this particular exemplary embodiment, the aperture mechanism may comprise a plurality of magnets, and the synchronization mechanism may be configured to change a magnetic force caused by the plurality of magnets in synchronization with the scanned spot beam, such that a magnetic aperture allows the scanned spot beam to pass through but blocks the one or more parasitic beamlets associated with the spot beam. The synchronization mechanism may cause each magnet to produce a first deflection force on the one or more parasitic beamlets if the scanned spot beam is between the pair of magnetic poles, and to produce a second deflection force if the scanned spot beam is not between the pair of magnetic poles. The first deflection force may be negligibly small and the second deflection force may be strong enough to deflect at least one parasitic beamlet. The plurality of magnets may comprise an array of coils, and the synchronization mechanism may vary a driving current supplied to each coil, such that a magnetic aperture allows the scanned spot beam to pass through but blocks the one or more parasitic beamlets associated with the spot beam.

In accordance with a further aspect of this particular exemplary embodiment, the aperture mechanism may comprise a plurality of shutter plates blocking predetermined width of the ion beam, and the synchronization mechanism may be configured to sequentially retract a shutter plate to allow the scanned spot beam to pass through as the scanned spot beam reaches the location of that shutter plate. Each shutter plate may be individually actuated by a Piezo circuit.

In another particular exemplary embodiment, the techniques may be realized as a method for preventing parasitic beamlets from affecting ion implantation. The method may comprise scanning a spot beam back and forth, thereby forming an ion beam spanning a predetermined width. The method may also comprise providing an aperture mechanism that, if kept stationary, allows the spot beam to pass through. The method may further comprise causing the aperture mechanism to move in synchronization with the scanned spot beam, thereby allowing the scanned spot beam to pass through but blocking one or more parasitic beamlets associated with the spot beam.

In yet another particular exemplary embodiment, the techniques may be realized as at least one signal embodied in at least one carrier wave for transmitting a computer program of instructions configured to be readable by at least one processor for instructing the at least one processor to execute a computer process for performing the method as recited above.

In still another particular exemplary embodiment, the techniques may be realized as at least one processor readable carrier for storing a computer program of instructions configured to be readable by at least one processor for instructing the at least one processor to execute a computer process for performing the method as recited above.

In a further particular exemplary embodiment, the techniques may be realized as an apparatus for preventing parasitic beamlets from affecting ion implantation. The apparatus may comprise a plurality of baffles positioned in a beam path associated with an ion beam, each baffle having a sufficiently high aspect ratio and being aligned with a desired ion trajectory at the baffle location in the beam path such that at least a portion of deviating ions in the ion beam are absorbed by the baffle.

In accordance with other aspects of this particular exemplary embodiment, the ion beam may be a ribbon beam.

In accordance with further aspects of this particular exemplary embodiment, each baffle may be sufficiently thin to avoid blocking a substantial part of the ion beam.

In accordance with additional aspects of this particular exemplary embodiment, the apparatus may further comprise a mechanism that dithers the plurality of baffles relative to the ion beam to avoid a shadowing effect on a target wafer caused by the plurality of baffles.

In accordance with another aspect of this particular exemplary embodiment, the apparatus may further comprise a mechanism that dithers a target wafer relative to the ion beam to avoid a shadowing effect caused by the plurality of baffles.

In accordance with yet another aspect of this particular exemplary embodiment, at least a portion of the plurality of baffles can be retracted out of the beam path.

In accordance with still another aspect of this particular exemplary embodiment, at least a portion of the plurality of baffles may have adjustable angles.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 3A and 3B show an exemplary implementation of a moveable aperture in accordance with an embodiment of the present disclosure.

DETAILED DESCRIPTION OF EXEMPLARY EMBODIMENTS

Figure 1:
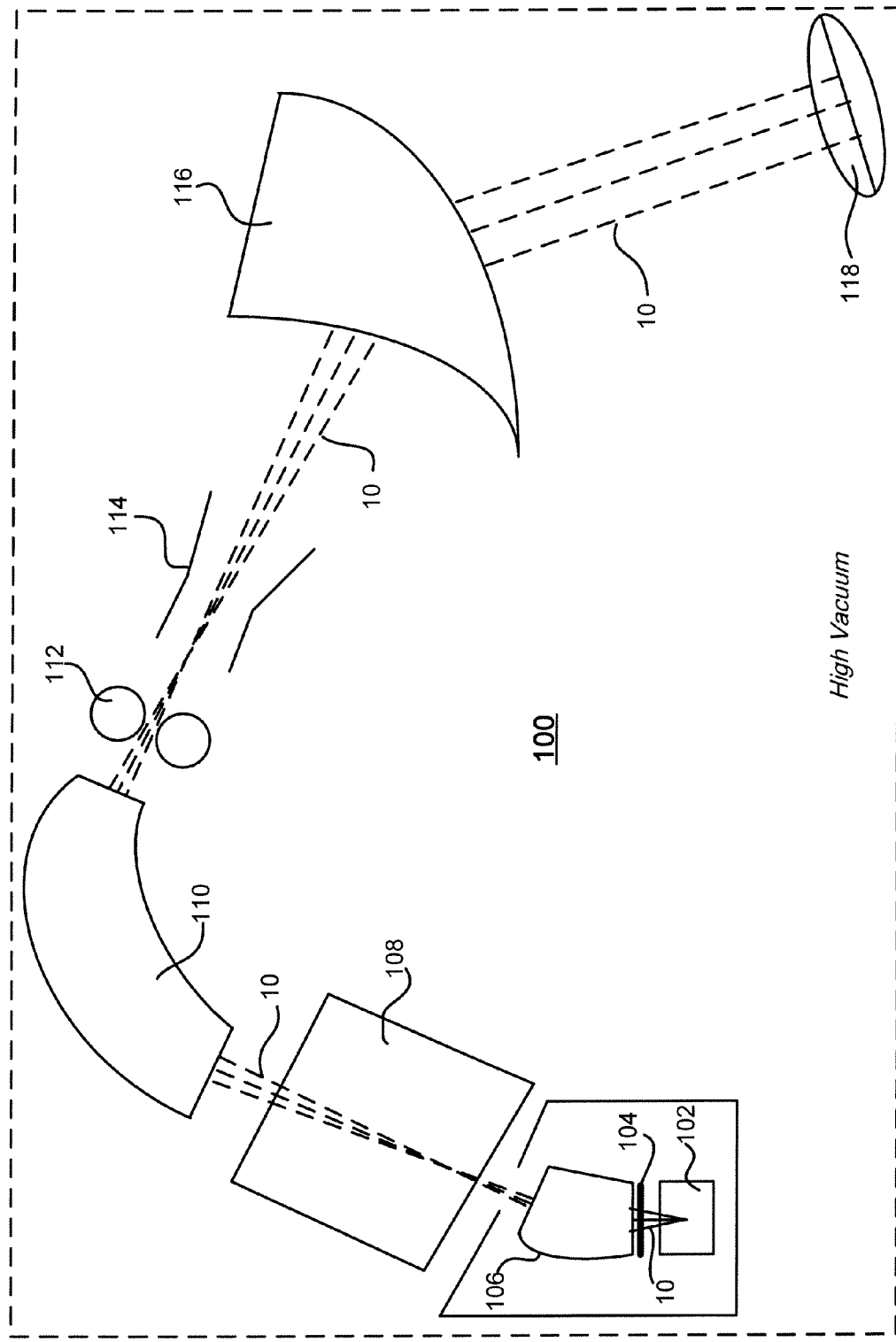
FIG. 1 shows an existing ion implanter.
Figure 2:
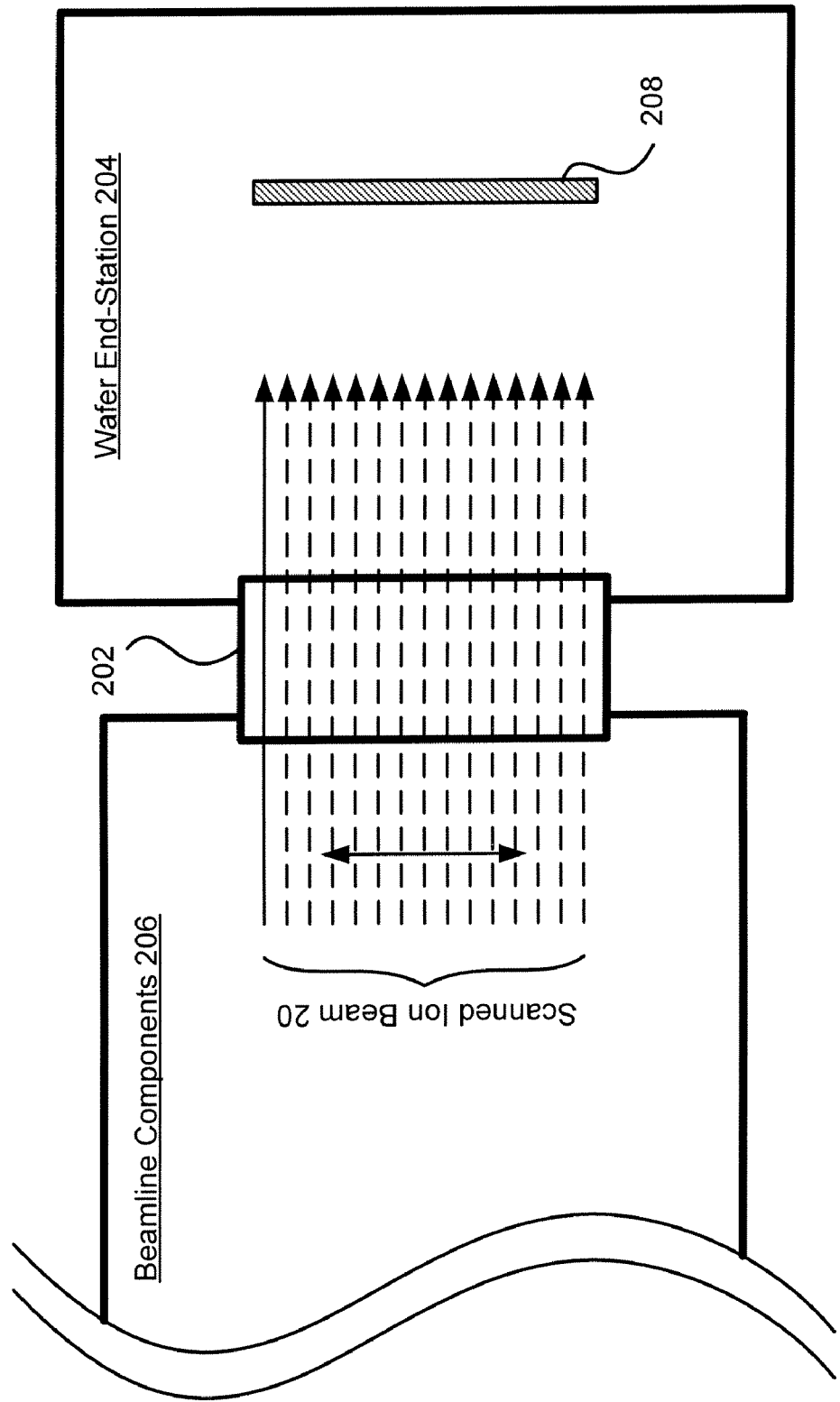
FIG. 2 illustrates an existing method for reducing effects of photoresist outgassing.

Embodiments of the present disclosure provide various techniques to prevent parasitic beamlets (e.g., those generated as a result of photoresist outgassing) from affecting ion implantation. According to some embodiments, a moveable aperture may be implemented to limit downstream transport of parasitic beamlets. The moveable aperture may be as small as a static spot beam and may move in synchronization with scanning movement of the spot beam. An added effect of the moveable (or scan-synchronized) aperture is to limit upstream migration of outgassed particles. According to other embodiments, a plurality of baffles may be positioned in a beam path and aligned with desired ion trajectories, thereby filtering out unwanted parasitic beamlets.

Referring to FIGS. 3A and 3B, there is shown an exemplary implementation of a moveable aperture in accordance with an embodiment of the present disclosure. FIG. 3A shows a front view of an aperture mechanism 300, and FIG. 3B shows a top view of the aperture mechanism 300. The aperture mechanism 300 may be located in an ion implanter, for example, at or near an entrance of a wafer end-station (not shown) or other locations where blocking (e.g., deflecting, absorbing, or otherwise intercepting) of parasitic beamlets might be desired.

The aperture mechanism 300 may comprise a shutter plate 302. The shutter plate 302 may be made of any type of material, rigid or flexible and in an appropriate shape, that is capable of blocking energetic ions. In this embodiment, the shutter plate 302 is a rectangular strip made of a flexible material. In the shutter plate 302, e.g., at approximately its center, there may be an aperture 304 whose size and/or shape is chosen to allow a spot beam 30 to pass through. Typically, the aperture 304 may be the same as or slightly larger than the spot beam 30. Therefore, if the shutter plate 302 (thus the aperture 304) remains stationary, the spot beam 30 may be able to pass through the aperture 304 while at least some parasitic beamlets associated with the spot beam 30 may be blocked if those parasitic beamlets deviate more than a predetermined amount from a desired ion trajectory. Although it is shown in FIG. 3A with a circular cross-section, the spot beam 30 may have a cross-section of any shape. Therefore, it should be appreciated that the term "spot beam" as used herein is not limited to any particular beam shape.

During ion implantation, a controller (not shown) may scan the spot beam 30 back and forth, thereby forming an ion beam spanning a predetermined width ("scan width"). In FIG. 3A, a dashed box 36 outlines a range in which the spot beam 30 may be scanned. The controller may employ electrostatic and/or electromagnetic means to scan the spot beam 30. The scan frequency may be sufficiently high (e.g., 1 kHz) such that the resulting ion beam may be considered, for example, a unified ribbon beam.

The aperture mechanism 300 may be coupled to a synchronization mechanism (not shown) that is configured to cause the aperture mechanism 300 to move in synchronization with the scanned spot beam 30. That is, as the spot beam 30 is scanned back and forth, the synchronization mechanism may keep the aperture 304 aligned with the scanned spot beam 30 at any location along the scan width. As a result, the scanned spot beam 30 may be allowed to pass through the aperture 304 into the wafer end-station while one or more parasitic beamlets associated with the spot beam 30 may be blocked from entering the wafer end-station. In FIG. 3B, dashed boxes 32 and 34 indicate endpoints to which the aperture 304 reaches in its synchronized movement with the scanned spot beam 30.

Figure 4:
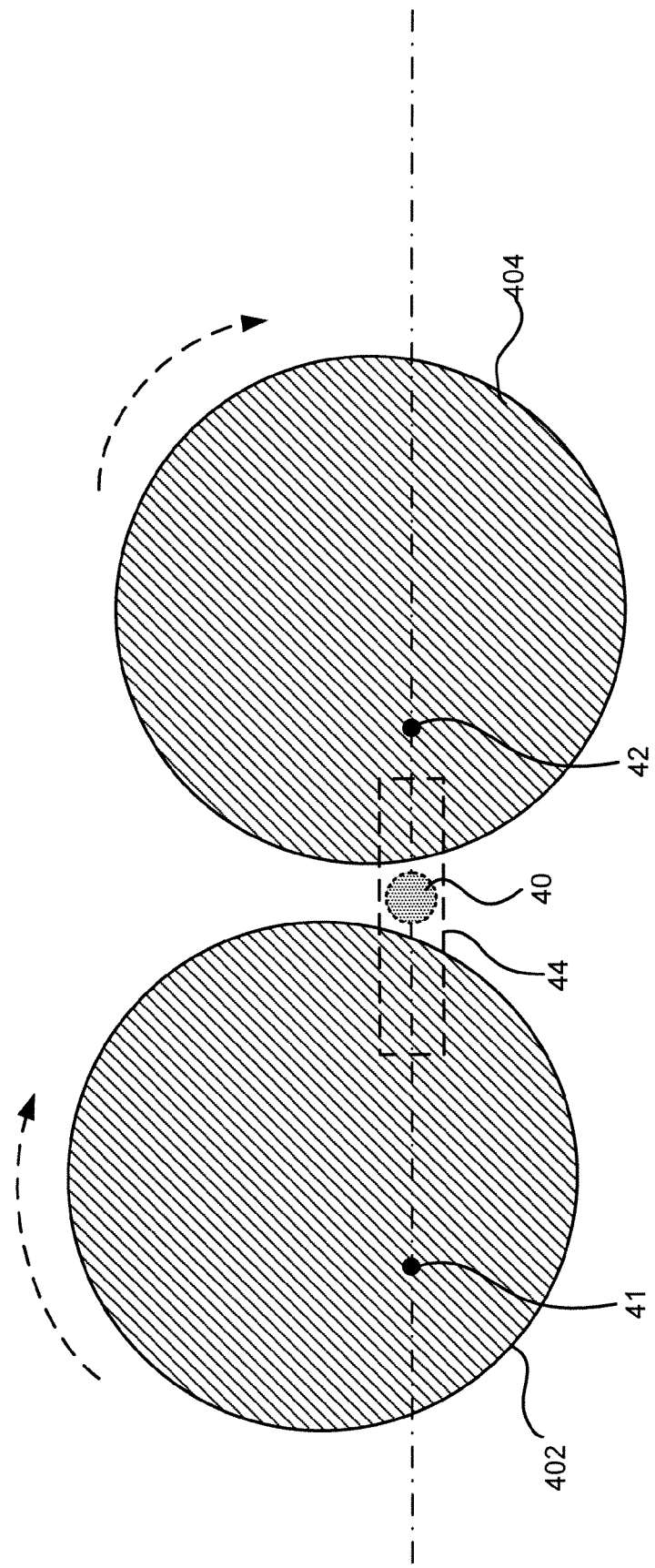
FIG. 4 shows an exemplary implementation of a moveable aperture based on two rotatable shutter plates in accordance with an embodiment of the present disclosure.

FIG. 4 shows an exemplary implementation of a moveable aperture based on two rotatable shutter plates 402 and 404 in accordance with an embodiment of the present disclosure. The shutter plates 402 and 404 may be located at or near an entrance of a wafer end-station (not shown) in an ion implanter. The shutter plates 402 and 404 may be respectively hinged to and rotate around two axis 41 and 42 which are in parallel with a beam path of a spot beam 40.

In operation, the spot beam 40 may be scanned horizontally over a range as outlined by a dashed box 44. Meanwhile, the shutter plates 402 and 404 may rotate in coordination with each other and in synchronization with the scanned spot beam 40, such that the opening formed between the shutter plates 402 and 404 tracks the scanned spot beam 40. The effect may be a moveable aperture that allows the scanned spot beam 40 to pass through but blocks at least a portion of parasitic beamlets associated with the spot beam 40. With this purpose in mind, it will be appreciated that the shutter plates 402 and 404 do not have to be circular plates as shown here but may have various shapes to achieve a desired shape and/or movement of the moveable aperture. In addition, the width of the moveable aperture may be altered by changing the phase of the rotating shutter plates 402 and 404. According to some embodiments, the shutter plates 402 and 404 may be mounted in way so that they may be rotated or otherwise moved completely out of the beam path.

In further alternative embodiments, only one rotating shutter plate may be needed to achieve the purpose of blocking parasitic beamlets. For example, in FIG. 4, if it is determined that charge exchanges in a preceding corrector magnet always rob positive ions in the spot beam 40 of positive charges, then the charge-exchanged ions (i.e., parasitic beamlets) exiting the corrector magnet will be on one side of the spot beam 40, for example, the left side. In that case, only the left shutter plate 402 is needed to block those charge-exchanged ions, and the right shutter plate 404 may be removed.

Figure 5:
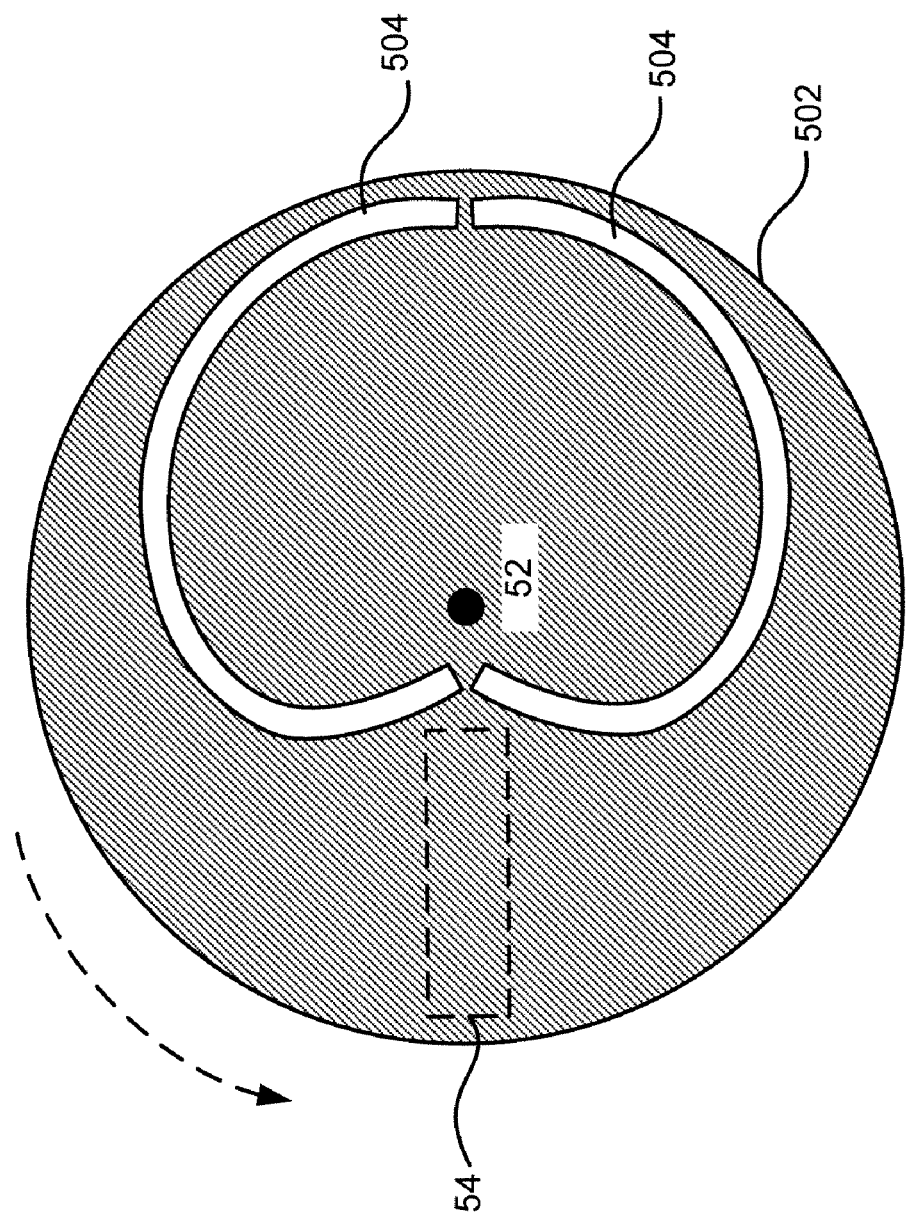
FIG. 5 shows an exemplary implementation of a moveable aperture based on a rotatable member in accordance with an embodiment of the present disclosure.

FIG. 5 shows an exemplary implementation of a moveable aperture based on a rotatable member 502 in accordance with an embodiment of the present disclosure. The rotatable member 502 may be configured to rotate around an axis 52 that extends in parallel with a spot beam (not shown). The rotatable member 502 may have one or more slits 504 having a spiral pattern. The slits 504 may be slightly wider than the spot beam.

In operation, as the spot beam is scanned horizontally over a range as outlined by a dashed box 54, the rotatable member 502 may rotate at approximately half the scan frequency. The shape of the slits 504 ensures that an aperture is provided for the spot beam to pass through at any location in the scan range. That is, the rotation of the rotatable member 502 will cause different portions of the slits 504 to pass through the dashed box 54 and the horizontal position of the slit opening will coincide with the location of the spot beam.

Figure 6:
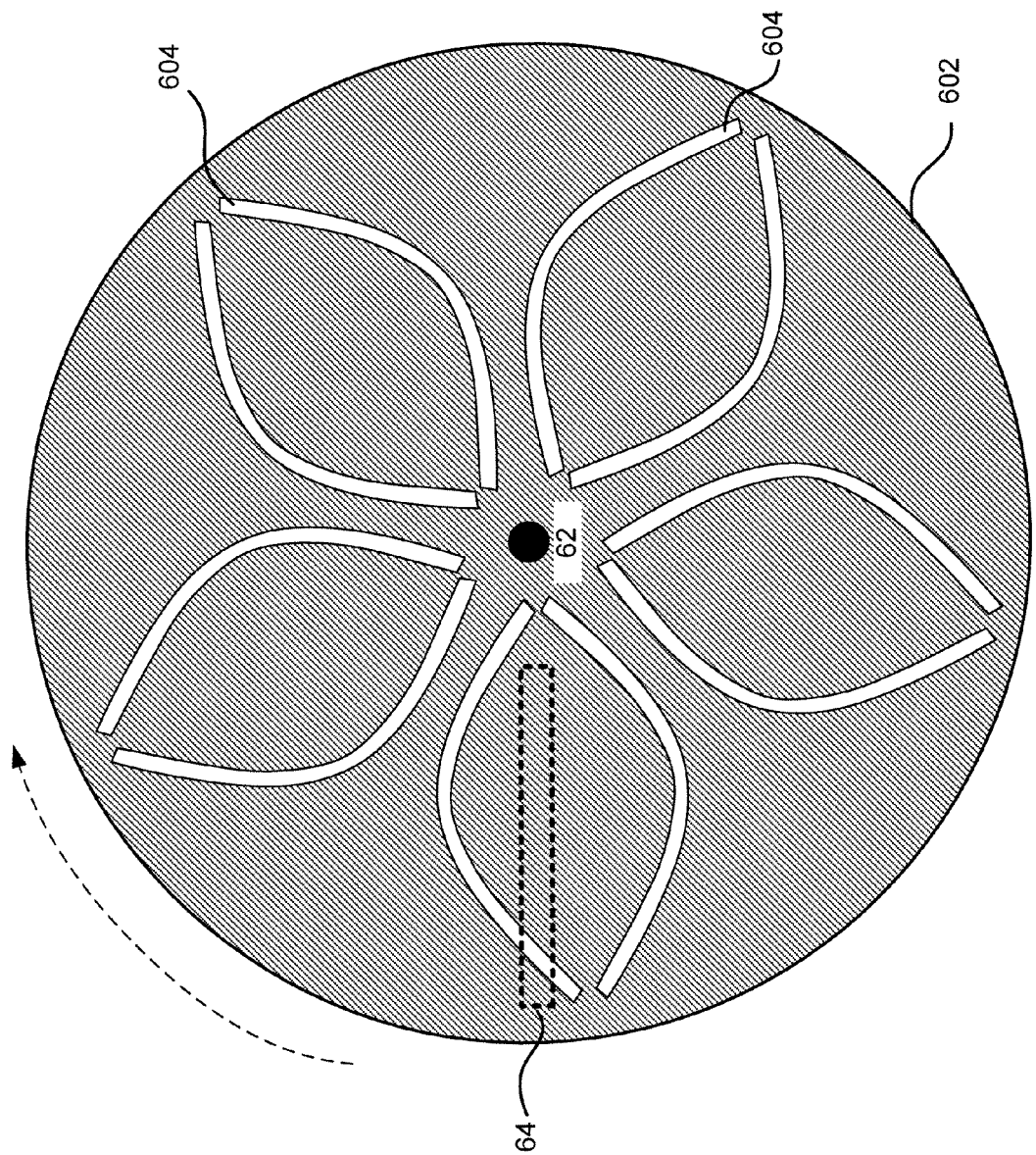
FIG. 6 shows another exemplary implementation of a moveable aperture based on a rotatable member in accordance with an embodiment of the present disclosure.

FIG. 6 shows another exemplary implementation of a moveable aperture based on a rotatable member 602 in accordance with an embodiment of the present disclosure. This implementation is an extension of the one shown in FIG. 5. The rotatable member 602 may be substantially larger than the rotatable member 502. Instead of one set of slits 504 as shown in FIG. 5, the rotatable member 602 has multiple sets of slits 604. As a result, the rotatable member 602 may rotate around its axis 62 at a much lower frequency but still be able to provide a scan-synchronized aperture for a spot beam that scans in a range outlined by a dashed box 64.

Figure 7:
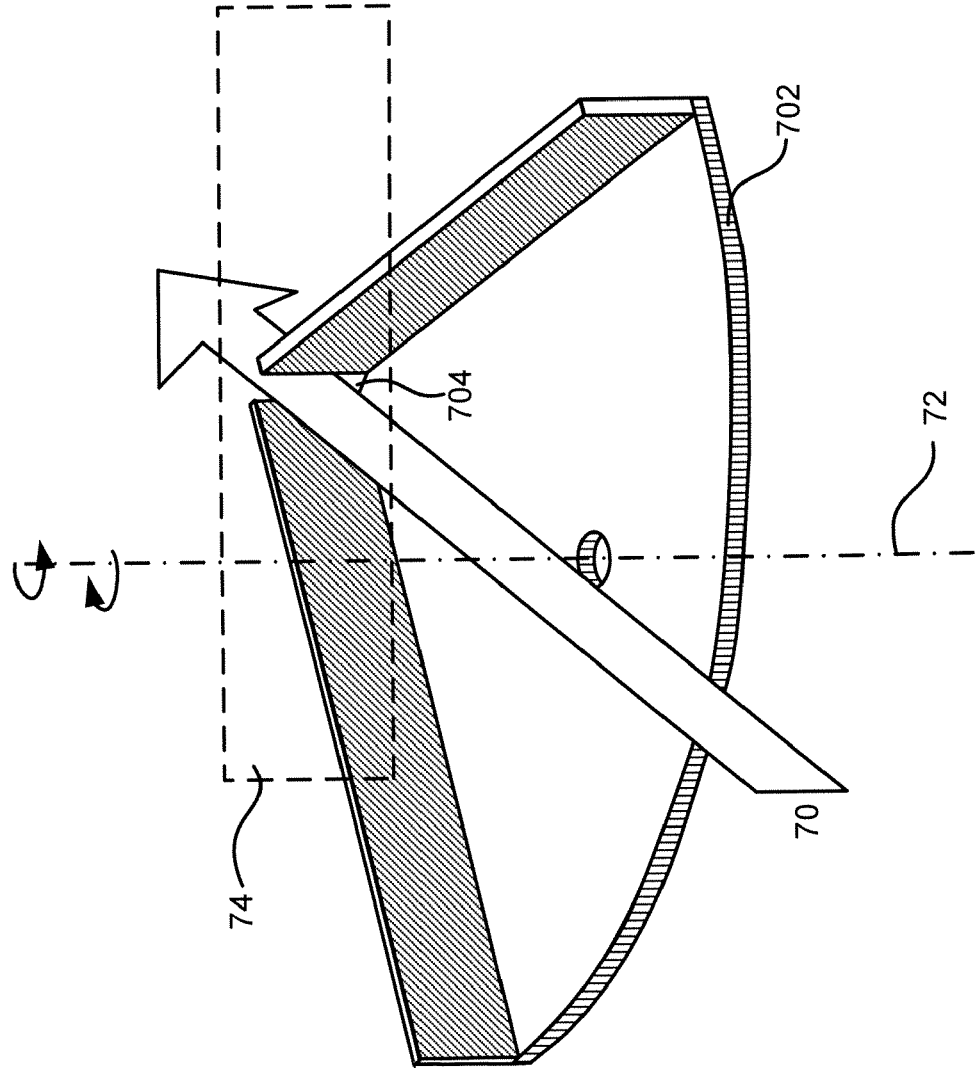
FIG. 7 shows yet another exemplary implementation of a moveable aperture based on a rotatable member in accordance with an embodiment of the present disclosure.

FIG. 7 shows yet another exemplary implementation of a moveable aperture based on a rotatable member 702 in accordance with an embodiment of the present disclosure. Compared with the exemplary implementation illustrated in FIGS. 5 and 6, the rotatable member 702 is configured to rotate around an axis 72 that is perpendicular to the propagation direction of an ion beam 70. The rotatable member 702 may provide a vertical slit aperture 704 for the ion beam 70 to pass through while blocking one or more parasitic or deviating beamlets. As the ion beam 70 is scanned horizontally over a range as outlined by a dashed box 74, the rotatable member 702 may rotate in synchronization with the scanned ion beam 70 to cause the slit aperture 704 to track the scanning movement of the ion beam 70.

Figure 8:
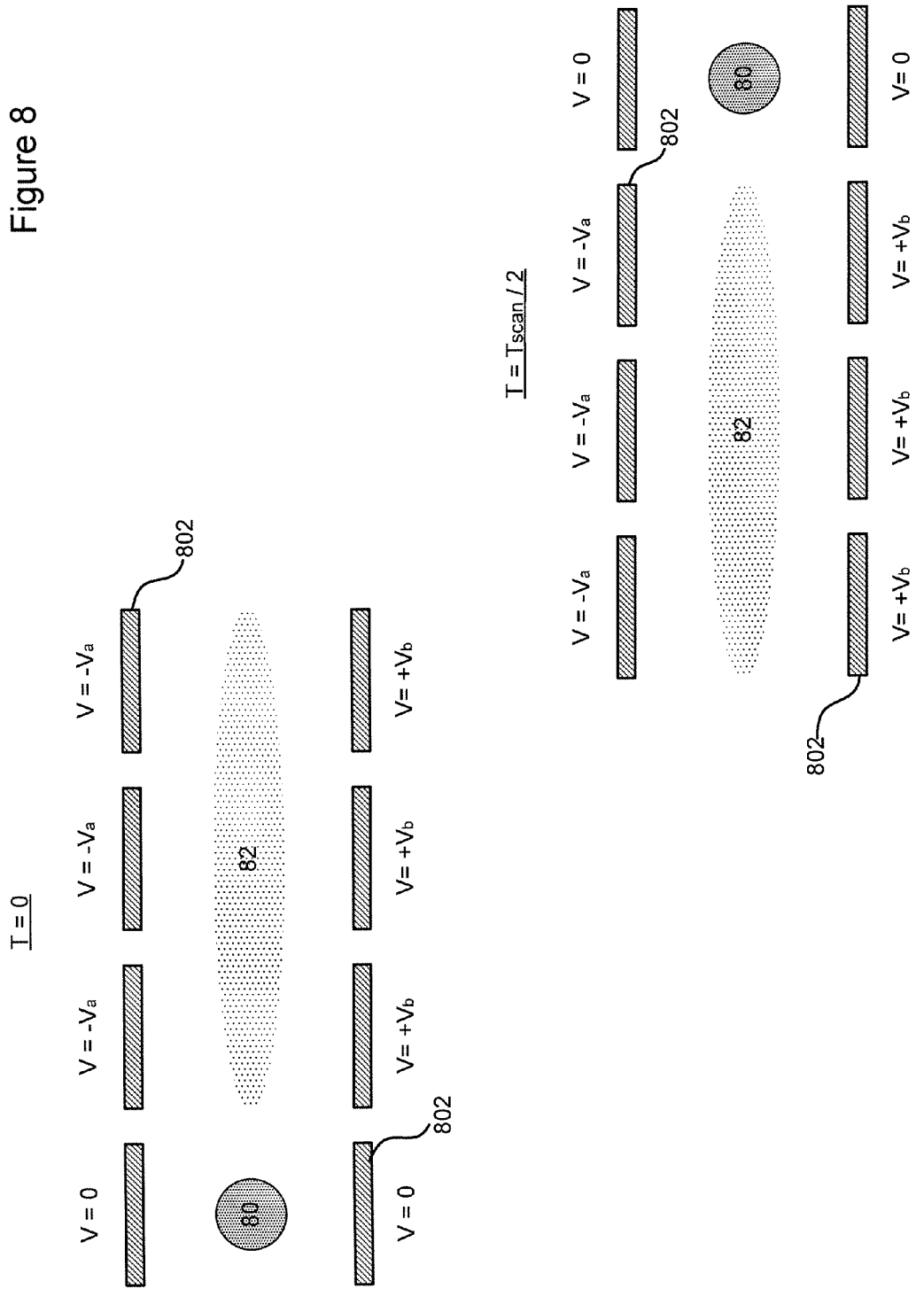
FIG. 8 shows an exemplary implementation of a moveable electrostatic aperture in accordance with an embodiment of the present disclosure.

FIG. 8 shows an exemplary implementation of a moveable electrostatic aperture in accordance with an embodiment of the present disclosure. The "moveable" electrostatic aperture may be implemented with a plurality of electrodes, such as, for example, four pairs of parallel plates 802. These parallel plates 802 may be individually biased to selectively deflect parasitic beamlets 82 associated with a spot beam 80. The parallel plates 802 may be positioned above and below the spot beam 80 and may be located at the exit of a corrector magnet or at the entrance of a wafer end-station.

In operation, the spot beam 80 may be scanned horizontally. Voltages applied to the four pairs of parallel plates 802 may be changed in synchronization with the scanned spot beam 80. That is, each pair of parallel plates 802 may be biased with zero voltage if the scanned spot beam happens to be between that pair of parallel plates 80. Otherwise, a substantial deflection voltage may be applied to a pair of parallel plates 802 if the scanned spot beam is not between that pair of parallel plates 802. FIG. 8 illustrates this time-based operation by showing voltage patterns at T=0 and $T=T_{scan}/2$, wherein $T_{scan}$ denotes the length of a scan cycle. At T=0, the spot beam 80 is scanned to the left side of its scan range. Accordingly, the leftmost pair of parallel plates 802 are biased with zero voltage, while the pairs of parallel plates 802 are biased with substantial deflection voltages (i.e., $-V_a$ and $+V_b$) to filter out parasitic beamlets 82. At $T=T_{scan}/2$, the spot beam 80 has been scanned to the right side of its scan range. Accordingly, the rightmost pair of parallel plates 802 are biased with zero voltage, while the pairs of parallel plates 802 are biased with substantial deflection voltages (i.e., $-V_a$ and $+V_b$).

Figure 9:
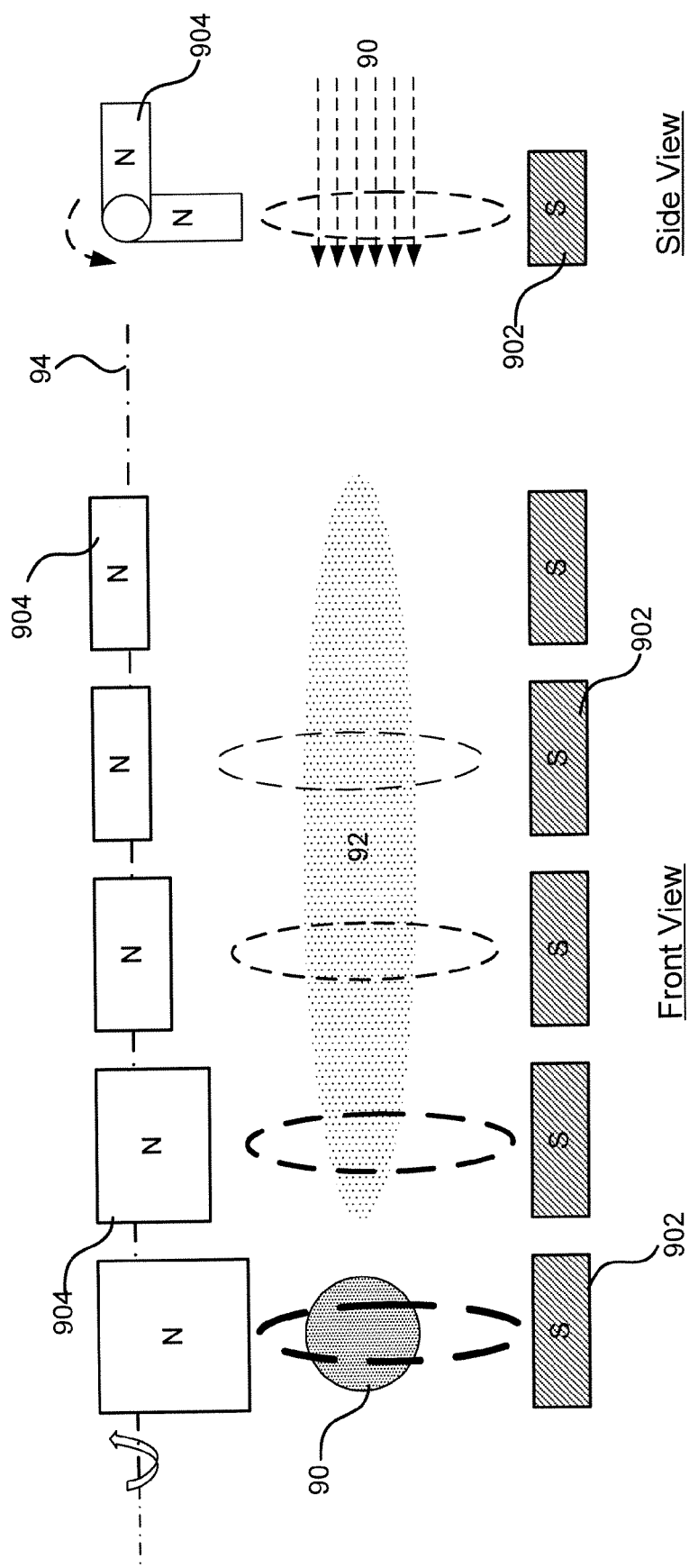
FIG. 9 shows an exemplary implementation of a moveable magnetic aperture in accordance with an embodiment of the present disclosure.

FIG. 9 shows an exemplary implementation of a moveable magnetic aperture in accordance with an embodiment of the present disclosure. The "moveable" magnetic aperture may be implemented with a plurality of magnetic poles (902 and 904) arranged into a first bank and a second bank. The first bank may comprise south poles 902, and the second bank may comprise north poles 904 hinged on a common axis 94. The north poles 904 may be selectively rotated or otherwise adjusted to alter magnetic forces they respectively produce with their corresponding south poles 902. FIG. 9 shows a front view and a side view of this arrangement.

In operation, a spot beam 90 may be scanned horizontally as shown in the front view. The north poles 904 may be rotated in coordination with one another and further in synchronization with the scanned spot beam 90, such that off-angle and/or parasitic beamlets associated with the spot beam 90 may be selectively deflected. For example, in a location where the spot beam 90 is scanned to, the deflecting magnetic field may be made negligibly small, whereas the rest of the locations may see a significant deflection magnetic field. Similar to the moveable electrostatic aperture described above, the selective deflection of the undesired ions with magnetic means may be viewed as providing a moveable "magnetic aperture." This implementation may be deployed at the end of a drift space to reduce contamination formed along an inner radius of a corrector magnet.

In an alternative embodiment, the "moveable" magnetic aperture may be realized with a plurality of electromagnets (e.g., individual coils) arranged in a similar fashion as the parallel plates 802 as shown in FIG. 8. The aperture movement may then be controlled by varying currents supplied to the individual coils in synchronization with the scanned ion beam.

Figure 10:
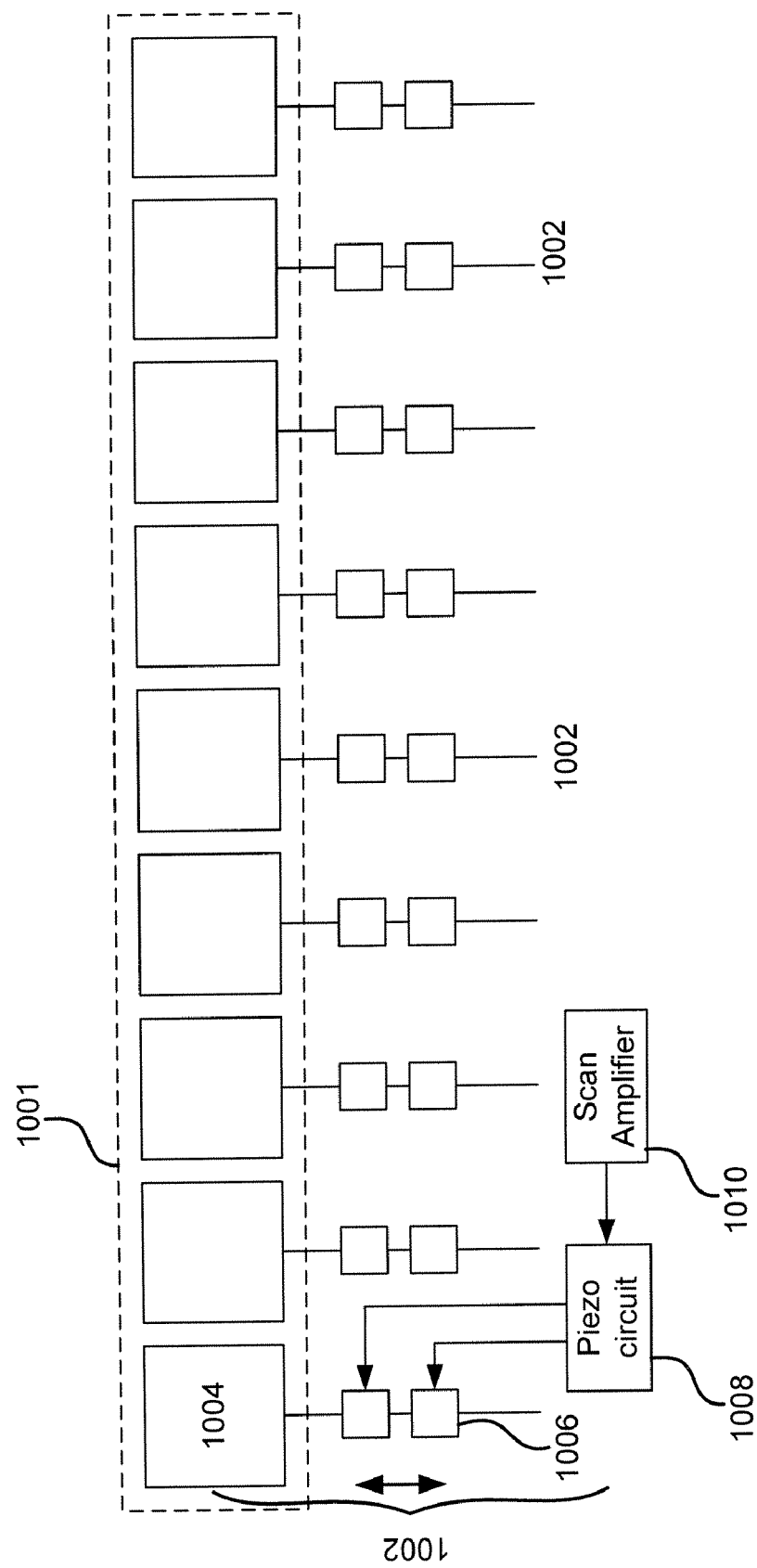
FIGS. 10 and 11 show an exemplary implementation of a moveable aperture based on shutter plates driven by Piezo circuits in accordance with an embodiment of the present disclosure.
Figure 11:
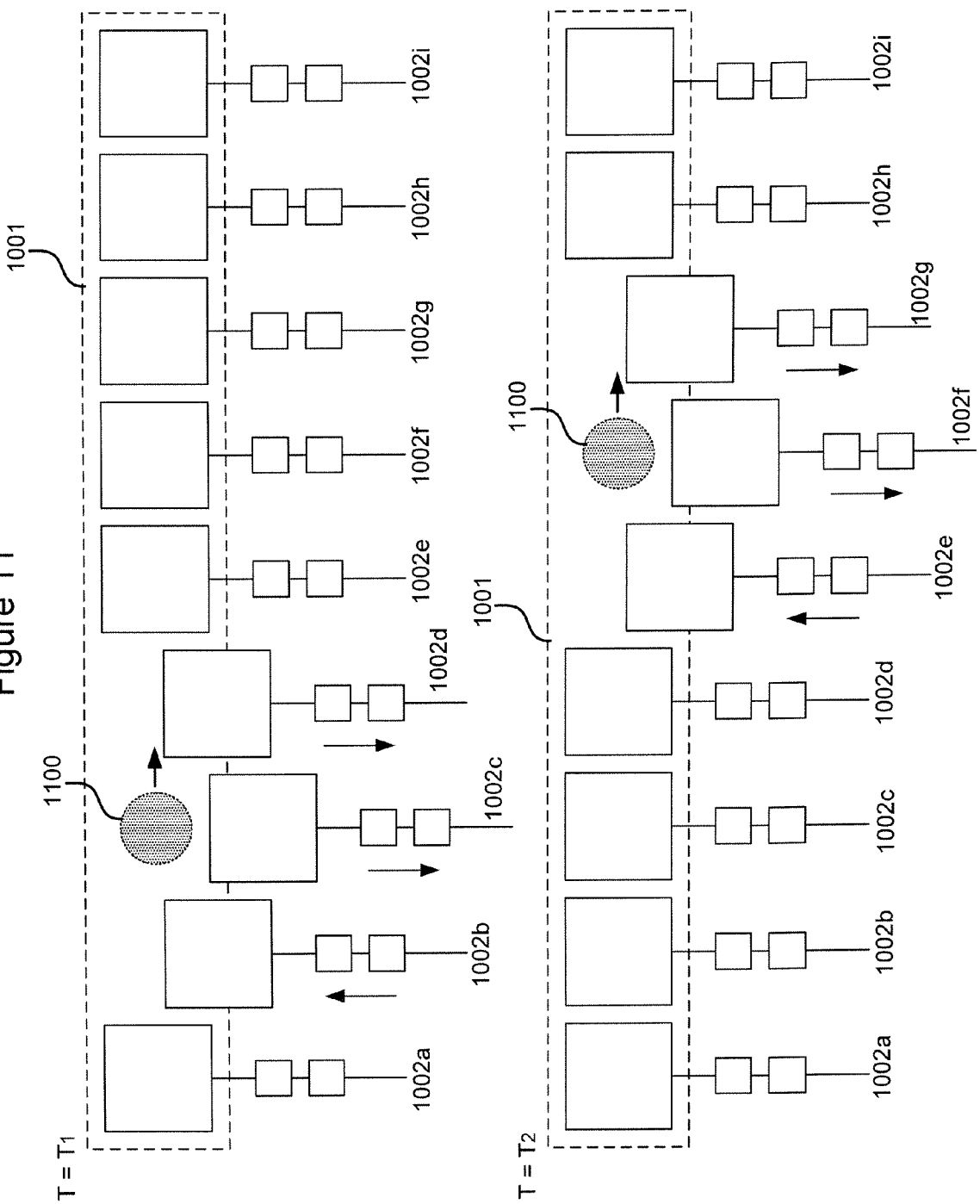

FIGS. 10 and 11 show an exemplary implementation of a moveable aperture based on shutter plates driven by Piezo circuits in accordance with an embodiment of the present disclosure. FIG. 10 shows a plurality of shutter elements 1002 having shutter plates 1004 that collectively block a scan range (dashed box 1001) of an ion beam. Each shutter plate 1004 may be coupled to one or more Piezo coils 1006 driven by a Piezo circuit 1008. The Piezo circuit 1008 may be coupled to a scan amplifier (or controller) 1010 that provides synchronization control with the scanned ion beam. The Piezo circuit 1008 may actuate the Piezo coils 1006 to retract the corresponding shutter plate 1004 or push the shutter plate 1004 back into place.

FIG. 11 illustrates an exemplary operation of the shutter elements 1002 (now distinguished with letters a-i). A spot beam 1100 is scanned horizontally across the scan range outlined by the dashed box 1001. At $T=T_1$, the spot beam 1100 has just scanned past the location of shutter element 1002b and is at the location of shutter element 1002c. In synchronization, the shutter element 1002b may be moving back to its original blocking position, the shutter element 1002c may be fully retracted to allow the spot beam 1100 to pass through, and the next shutter element 1002d may be starting to retract in anticipation of the arrival of the spot beam 1100. Then, at $T=T_2$, the spot beam 1100 is scanned to the location of shutter element 1002f. By now, the shutter elements 1002b, 1002c and 1002d have all returned to their respective blocking positions. In synchronization, the shutter element 1002e may be moving back to its original blocking position, the shutter element 1002f may be fully retracted to allow the spot beam 1100 to pass through, and the next shutter element 1002g may be starting to retract in anticipation of the arrival of the spot beam 1100.

Figure 12:
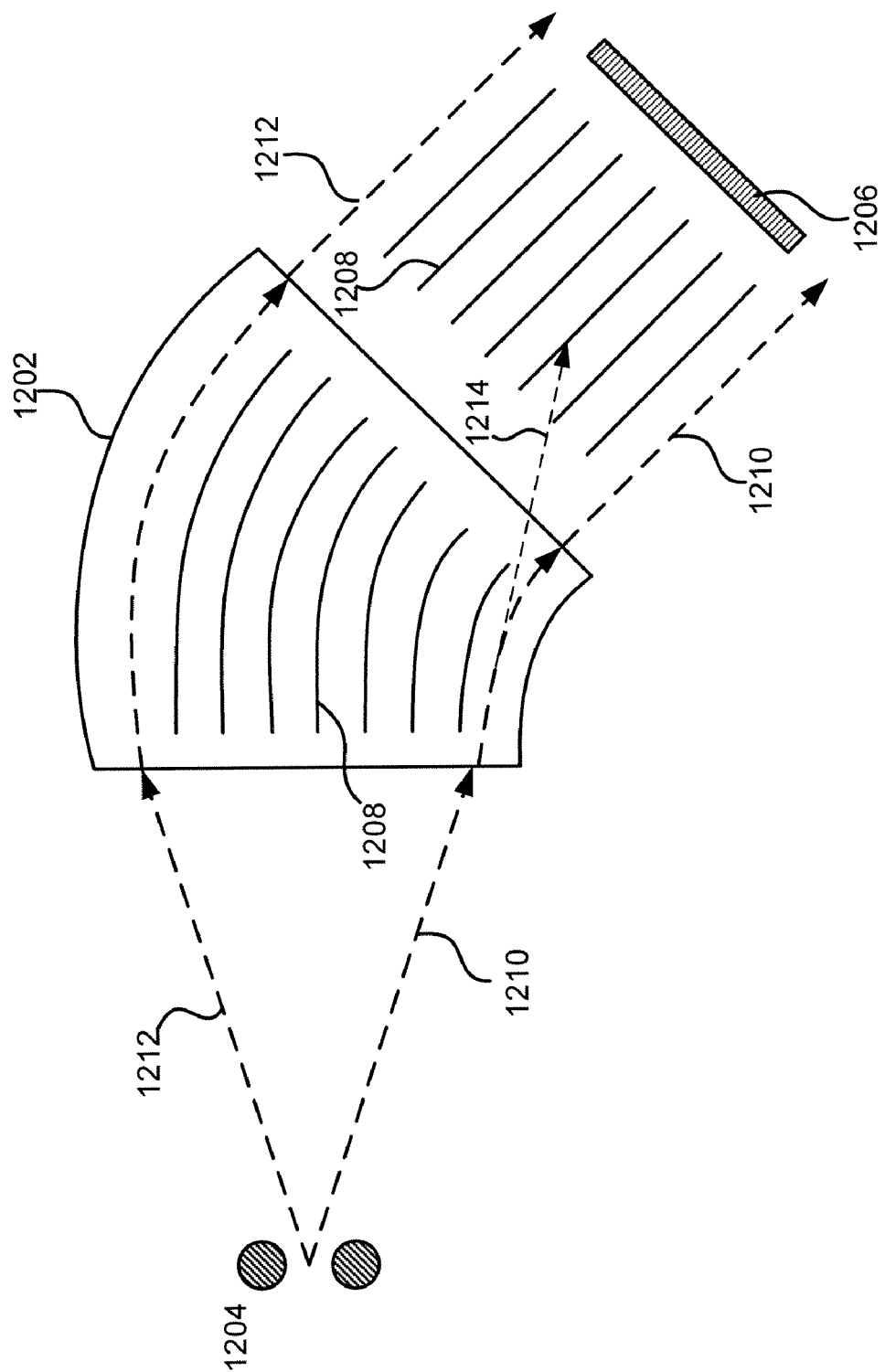
FIG. 12 shows an exemplary implementation of baffles for filtering parasitic beamlets in accordance with an embodiment of the present disclosure.

FIG. 12 shows an exemplary implementation of baffles for filtering parasitic beamlets in accordance with an embodiment of the present disclosure. In this implementation, an ion beam 1200, such as a ribbon beam or a scanned spot beam, may pass through a corrector magnet (or collimator) 1202. Dashed lines 1210 and 1212 indicate the envelope of the ion beam 1200 between a mass resolving slit 1204 and a target wafer 1206. In order to filter out off-angle or parasitic beamlets from the ion beam 1200, a plurality of high aspect ratio baffles 1208 may be positioned at the exit of the corrector magnet 1202 and/or between the target wafer 1206 and the corrector magnet 1202. Each baffle 1208 may be aligned with a desired ion trajectory at the baffle location such that energy-contaminated ions and/or ions that deviate from the desired ion trajectory more than a predetermined amount will be blocked by the baffle 1208. For example, if a beamlet 1214 (e.g., with undesired energy as compared to the main beam) goes off-angle near the exit of the corrector magnet 1202, the beamlet 1214 may end up hitting one of the baffles 1208 before ever reaching the target wafer 1206. For this purpose, the baffles 1208 may be sufficiently thin to avoid blocking any significant amount of non-deviating ions. In addition, the baffles 1208 may be textured to enhance absorption of the deviating ions and reduce bouncing and sputtering effects. According to one embodiment, the baffles 1208 may be made of graphite or silicon. According to another embodiment, it may be desirable to dither the ion beam 1200 to wash out on-axis ions that would otherwise be blocked due to the finite thickness of the baffles 1208. The dithering of the ion beam 1200 with respect to the baffles 1208 may be achieved with a number of methods. For example, the ion beam 1200 may be dithered with an added electrostatic or magnetic field component, for example, in or after the corrector magnet 1202 or at the mass resolving slit 1204. Alternatively, the baffles 1208 themselves may be dithered slightly to achieve a similar effect. According to other embodiments, the wafer 1206 itself may be dithered to reduce the shadowing effect caused by the baffles 1208 blocking the main ion beam 1200. The baffles 1208 may be temporarily removed or retracted from the beam path when they are not needed. Furthermore, the angles of the baffles 1208 may be adjusted, for example, relative to the ion beam or the wafer 1206. If the ion beam does not impinge on the wafer 1206 in exactly normal direction, the wafer 1206 may be tilted to compensate and so may the baffles 1208.

At this point it should be noted that the techniques for preventing parasitic beamlets from affecting ion implantation in accordance with the present disclosure as described above typically involve the processing of input data and the generation of output data to some extent. This input data processing and output data generation may be implemented in hardware or software. For example, specific electronic components may be employed in an ion implanter or similar or related circuitry for implementing the functions associated with blocking parasitic beamlets in accordance with the present disclosure as described above. Alternatively, one or more processors operating in accordance with stored instructions may implement the functions associated with blocking parasitic beamlets in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for preventing parasitic beamlets from affecting ion implantation, the apparatus comprising:
   a controller that is configured to scan a spot beam back and forth, thereby forming an ion beam spanning a predetermined width;
   an aperture mechanism that, if kept stationary, allows the spot beam to pass through; and
   a synchronization mechanism, coupled to the controller and the aperture mechanism, that is configured to cause the aperture mechanism to move in synchronization with the scanned spot beam, allowing the scanned spot beam to pass through but blocking one or more parasitic beamlets associated with the spot beam.

2. The apparatus according to claim 1, wherein the aperture mechanism is located at or near an entrance of an end-station in an ion implanter.

3. The apparatus according to claim 1, wherein
   the aperture mechanism comprises a shutter plate having an aperture that is slightly larger than the spot beam; and
   the shutter plate is actuated by the synchronization mechanism to slide the aperture back and forth in synchronization with the scanned spot beam.

4. The apparatus according to claim 3, wherein the shutter plate comprises a strip of flexible material.

5. The apparatus according to claim 3, wherein at least one portion of the shutter plate is folded then stretched when the shutter plate is actuated by the synchronization mechanism.

6. The apparatus according to claim 1, wherein the aperture mechanism comprises one or more shutter plates that rotate in synchronization with the scanned spot beam to block the one or more parasitic beamlets associated with the spot beam.

7. The apparatus according to claim 6, wherein the aperture mechanism comprises two shutter plates that rotate in coordination with each other to form a slit that moves in synchronization with the scanned spot beam.

8. The apparatus according to claim 1, wherein the aperture mechanism comprises a rotatable member having one or more slits such that, when the rotatable member is rotating at a predetermined frequency, the scanned spot beam is able to pass through one of the one or more slits at any location along the predetermined width of the ion beam.

9. The apparatus according to claim 8, wherein:
   the rotatable member has an axis of rotation substantially in parallel with the ion beam; and
   the one or more slits are curved according to a spiral pattern.

10. The apparatus according to claim 8, wherein:
    the rotatable member has an axis of rotation perpendicular to the ion beam; and
    the rotatable member is configured to oscillate around the axis to cause the one or more slits to move in synchronization with the scanned spot beam.

11. The apparatus according to claim 1, wherein:
    the aperture mechanism comprises a plurality of electrodes; and
    the synchronization mechanism is configured to change voltages applied to the plurality of electrodes in synchronization with the scanned spot beam, such that an electrostatic aperture allows the scanned spot beam to pass through but blocks the one or more parasitic beamlets associated with the spot beam.

12. The apparatus according to claim 11, wherein:
    the plurality of electrodes are arranged into multiple pairs of parallel plates; and
    the synchronization mechanism applies to each pair of parallel plates a zero voltage if the scanned spot beam is between the pair of parallel plates, and a substantial deflection voltage if the scanned spot beam is not between the pair of parallel plates.

13. The apparatus according to claim 1, wherein:
    the aperture mechanism comprises a plurality of magnets; and
    the synchronization mechanism is configured to change a magnetic force caused by the plurality of magnets in synchronization with the scanned spot beam, such that a magnetic aperture allows the scanned spot beam to pass through but blocks the one or more parasitic beamlets associated with the spot beam.

14. The apparatus according to claim 13, wherein the synchronization mechanism causes each magnet to produce a first deflection force on the one or more parasitic beamlets if the scanned spot beam is between the pair of magnets, and to produce a second deflection force if the scanned spot beam is not between the pair of magnets.

15. The apparatus according to claim 14, wherein the first deflection force is negligibly small and the second deflection force is strong enough to deflect at least one parasitic beamlet.

16. The apparatus according to claim 13, wherein:
    the plurality of magnets comprise an array of coils; and
    the synchronization mechanism varies a driving current supplied to each coil, such that a magnetic aperture allows the scanned spot beam to pass through but blocks the one or more parasitic beamlets associated with the spot beam.

17. The apparatus according to claim 1, wherein:
    the aperture mechanism comprises a plurality of shutter plates blocking predetermined width of the ion beam; and
    the synchronization mechanism is configured to sequentially retract a shutter plate to allow the scanned spot beam to pass through as the scanned spot beam reaches the location of that shutter plate.

18. The apparatus according to claim 17, wherein each shutter plate is individually actuated by a Piezo circuit.

19. A method for preventing parasitic beamlets from affecting ion implantation, the method comprising the steps of:
    scanning a spot beam back and forth, thereby forming an ion beam spanning a predetermined width;
    providing an aperture mechanism that, if kept stationary, allows the spot beam to pass through; and
    causing the aperture mechanism to move in synchronization with the scanned spot beam, thereby allowing the scanned spot beam to pass through but blocking one or more parasitic beamlets associated with the spot beam.

20. At least one signal embodied in at least one carrier wave for transmitting a computer program of instructions configured to be readable by at least one processor for instructing the at least one processor to execute a computer process for performing the method as recited in claim 19.

21. At least one processor readable carrier for storing a computer program of instructions configured to be readable by at least one processor for instructing the at least one processor to execute a computer process for performing the method as recited in claim 19.

22. An apparatus for preventing parasitic beamlets from affecting ion implantation, the apparatus comprising:
    a plurality of baffles positioned in a beam path associated with an ion beam, each baffle having a sufficiently high aspect ratio and being aligned with a desired ion trajectory at the baffle location in the beam path such that at least a portion of deviating ions in the ion beam are absorbed by the baffle.

23. The apparatus according to claim 22, wherein the ion beam is a ribbon beam.

24. The apparatus according to claim 22, wherein each baffle is sufficiently thin to avoid blocking a substantial part of the ion beam.

25. The apparatus according to claim 22, further comprising:
   a mechanism that dithers the plurality of baffles relative to the ion beam to avoid a shadowing effect on a target wafer caused by the plurality of baffles.

26. The apparatus according to claim 22, further comprising:
   a mechanism that dithers a target wafer relative to the ion beam to avoid a shadowing effect caused by the plurality of baffles.

27. The apparatus according to claim 22, wherein at least a portion of the plurality of baffles can be retracted out of the beam path.

28. The apparatus according to claim 22, wherein at least a portion of the plurality of baffles have adjustable angles.

* * * * *